US007309985B2

(12) United States Patent
Eggers et al.

(10) Patent No.: US 7,309,985 B2
(45) Date of Patent: Dec. 18, 2007

(54) METHOD OF RECONSTRUCTING AN MR IMAGE

(75) Inventors: Holger Eggers, Kaltenkirchen (DE); Peter Boernert, Hamburg (DE)

(73) Assignee: Koninklijke Philips Electronics N. V., Eindhoven (NL)

( * ) Notice: Subject to any disclaimer, the term of this patent is extended or adjusted under 35 U.S.C. 154(b) by 0 days.

(21) Appl. No.: 10/554,121

(22) PCT Filed: Apr. 14, 2004

(86) PCT No.: PCT/IB2004/001212

§ 371 (c)(1),
(2), (4) Date: Aug. 8, 2006

(87) PCT Pub. No.: WO2004/095051

PCT Pub. Date: Nov. 4, 2004

(65) Prior Publication Data

US 2006/0273789 A1    Dec. 7, 2006

(30) Foreign Application Priority Data

Apr. 23, 2003   (EP) .............................. 031011083

(51) Int. Cl.
*G01V 3/00* (2006.01)
(52) U.S. Cl. ..................................... 324/309; 324/307
(58) Field of Classification Search ................ 324/309, 324/307
See application file for complete search history.

(56) References Cited

U.S. PATENT DOCUMENTS 5,053,958 A    10/1991   Tam
5,241,471 A    8/1993    Trousset et al.
6,184,682 B1   2/2001    Ehman et al.
6,249,595 B1   6/2001    Foxall et al.
6,326,786 B1   12/2001   Pruessmann et al.
6,418,243 B1   7/2002    Skoglund et al.
6,545,472 B2 * 4/2003    Prussmann et al. ......... 324/307

FOREIGN PATENT DOCUMENTS

WO   WO 01/73463 A1   10/2001

OTHER PUBLICATIONS

Kannengiesser, S.A.R., et al.; Accelerated Image Reconstruction for Sensitivity Encoded Imaging with Arbitrary k-Space Trajectories; 2000; Proc. Intl. Soc. Mag. Reson. Med 8 p. 155.
Pruessmann, K.P., et al.; A Gridding Approach for Sensitivity Encoding with Arbitrary Trajectories; 2000; Proc. Intl. Soc. Mag. Reson. Med.; 8:p. 276.
Pruessmann, K.P., et al.; Advances in Sensitivity Encoding with Arbitrary k-Space Trajectories; 2001; MRM; 46:638-651.

* cited by examiner

Primary Examiner—Louis M. Arana

(57) ABSTRACT

An MR image (14) is reconstructed from MR signals (1, 2, 3, 4) that are acquired in parallel by a plurality of receiving coils (5, 6, 7, 8) with incomplete sampling of the spatial frequency space. The reconstructed MR image (14) is calculated iteratively as the solution of a system of linear equations. To provide a more highly developed method for parallel SENSE imaging, an iteration process (15) begins with a starting image (9) which approximates to the MR image to be reconstructed (14), in such a way that undersampling artifacts are suppressed in the intermediate solutions of the system of equations that are obtained during the course of the iteration process.

14 Claims, 3 Drawing Sheets

METHOD OF RECONSTRUCTING AN MR IMAGE

The invention relates to a method of reconstructing an MR image from MR signals that are acquired in parallel by a plurality of receiving coils with incomplete sampling of the spatial frequency space, the reconstructed MR image being calculated iteratively as the solution of a system of linear equations.

The invention also relates to an MR apparatus for performing the method and to a computer program for an apparatus of this kind.

In MR imaging, the location of the magnetization of nuclei within the examination volume is usually performed by means of temporally variable, spatially inhomogeneous magnetic fields (magnetic field gradients). The MR signals used for reconstructing the images are recorded, in the time domain, in the form of a voltage that is induced in a receiving coil arrangement surrounding the examination volume under the influence of a suitable sequence of magnetic-field gradient pulses and high-frequency pulses. The actual reconstruction of the images is then performed, for example, by Fourier transformation of the time-related signals. The sampling of the spatial frequency space (what is called the k-space), by which space the volumetric region to be imaged, or field of view (FOV), and the image resolution are in turn defined, is determined by the sequence that is preset for the magnetic-field gradient pulses and high-frequency pulses. The requirements that have to be met by the FOV and the image resolution preset the number of phase encoding steps in the sampling of the spatial frequency space and hence the duration of the imaging sequence. A major problem with MR imaging arises as a direct result of this. It often takes an undesirably long time to acquire an image of the desired resolution of the complete FOV. This is particularly true when it is not only two-dimensional MR images that are to be acquired but also three (or more) dimensional ones such as, for example, ones having additional spectral dimensions.

A large number of further technical developments in the field of MR imaging are aimed at shortening the image acquisition time. Developments to the apparatus that make it possible for the magnetic field gradients to be switched as fast as possible have today reached the limits of what is feasible in technical terms and of what is physiologically acceptable for the patient. However, for a large number of applications the acquisition times are still too long.

There appears to be some prospect of overcoming the technical and physiological limits mentioned to which conventional MR imaging is subject with the parallel methods that have become known recently, such as, for example, the so-called SENSE (sensitivity encoding) technique. The finding on which this latter method is based is that the spatial sensitivity profile of the receiving coil arrangement used impresses on the MR signals spatial information that can be used in the reconstruction of the images. When a plurality of separate receiving coils each having a different spatial sensitivity profile are used in parallel, i.e. simultaneously, then, by combining the MR signals that are acquired in each case from an incomplete sampling of the spatial frequency space, the acquisition time for an image can be reduced in comparison with the conventional methods by a factor that, in good cases, is equal to the number of receiving coils used.

Because, in SENSE imaging, particular importance is attached to the spatial sensitivity profiles of the receiving coils used, the image reconstruction from the MR signals that are acquired in parallel by incomplete sampling of the spatial frequency space cannot take place, as is usual in the conventional MR methods, solely by Fourier transformation. In fact, special signal processing techniques are required for the reconstruction of the images in SENSE imaging.

For cases where the sampling of the spatial frequency space is Cartesian, there are known reconstruction methods for SENSE imaging in which a conventional Fourier transformation is first carried out for each receiving coil and this produces image data sets, affected by undersampling artifacts, whose number corresponds to the number of receiving coils used. In a second step, these image data sets are then combined to give a definitive MR image, with the knowledge that exists of the spatial sensitivity profiles of the receiving coils being used to allow the undersampling artifacts to be removed.

If, in the SENSE imaging, the sampling of the spatial frequency space takes place in a non-Cartesian fashion, such as, say, radially or spirally, the reconstruction of the images proves to be substantially more complicated. Prtissmann has proposed a method that is particularly effective in numerical terms in which the reconstructed MR image is calculated as the solution of a system of linear equations (see Klaas P. Prüssman et al.: "Advances in Sensitivity Encoding with Arbitrary K-Space Trajectories" in Magnetic Resonance in Medicine, Vol. 46, pages 638 to 651, 2001). Because of the size of the system of linear equations, it is solved, with an acceptable amount of computing work, iteratively by what is termed a conjugate gradient (CG) method. A disadvantage of the method proposed in the article mentioned is that what the iteration process begins with as a starting image is a "zero image", i.e. an entirely black image, which is a poor approximation of the definitive MR image. What this means is that, taking this starting image as its point of departure, the known iteration process converges comparatively slowly. Correspondingly lengthy computing times are required to reconstruct the definitive MR image.

Against this background, it is an object of the present invention to provide a method of reconstruction for SENSE imaging that is an improvement on the prior art in respect of the computing time required for image reconstruction.

Starting from a method of the kind defined in the opening paragraph, this object is achieved by virtue of the fact that the iteration process begins with a starting image which approximates to the MR image to be reconstructed, in such a way that undersampling artifacts are suppressed in the intermediate solutions of the system of equations that are obtained during the course of the iteration process.

It is found that, when a "zero image" is used as a starting image for the iteration, the intermediate image that exists after the first step of the iteration shows pronounced undersampling artifacts. A comparatively large number of iterations are then required before such undersampling artifacts have been entirely removed and the definitive MR image is available as a solution. In accordance with the invention, a considerably smaller number of iterations are needed for reconstructing the MR image if what is selected as a starting image is an image that is a better approximation of the MR image to be reconstructed than the zero image that is usually used. What in fact this ensures is that undersampling artifacts are suppressed in the intermediate images that are calculated during the course of the iteration process. The advantageous possibility exists of presetting accordingly the starting image with which the iteration process begins. What the invention achieves in this way is that the computing work required for the reconstruction of the definitive MR image is greatly reduced in comparison with the prior art.

In an advantageous variant of the method according to the invention, the starting image is generated by reconstructed restricted sub-regions of the starting image from those MR signals that are received by receiving coils that are of high respective sensitivities in the sub-regions concerned. Hence the starting image is assembled from part-images whose number corresponds to the number of receiving coils used, each of the part-images being reconstructed directly from MR signals associated with individual receiving coils. The sub-regions are selected in this case in line with the geometry of the spatial sensitivity profiles of the receiving coils concerned. Particularly fast convergence of the iterative reconstruction process, for moderate reduction factors, is obtained by this procedure.

Cases are conceivable in which, due to the degree of undersampling, certain sub-regions of the starting image cannot be reconstructed in the manner described above directly from the MR signals acquired by individual receiving coils, without the starting image suffering to an excessively high degree from undersampling artifacts. However, even when there is a high degree of undersampling (a high reduction factor), the starting image can be directly reconstructed with a small number of undersampling artifacts at least in individual sub-regions. The possibility then exists, by taking the image information for these sub-regions as a basis, of estimating the undersampling artifacts that can be expected in the sub-regions of the starting image that are still missing. Use can be made in this case of the knowledge that exists of the sampling pattern that is used in acquiring the images, i.e. the knowledge in particular of what is called the point-spread function. The missing image information in the starting image can then be synthesized from the MR signals by correcting the image reconstructed directly from the MR signals in the missing regions in line with the estimate of the undersampling artifacts that will occur in these regions. After this, the image as a whole will have a minimum of undersampling artifacts.

Alternatively, the starting image can be reconstructed at a resolution that is reduced in comparison with the definitive MR image. The desired resolution is then only obtained in the further course of the reconstruction process.

In cases in which either a plurality of MR images having FOVs that are adjacent in space are generated, to allow a volumetric image to be generated from slice images, for example, or a series of MR images spread over time are generated, in the imaging of dynamic processes, for example, a possibility that is open is, in accordance with the invention, to use as the starting image an MR image that already exists and that is similar to the MR image to be reconstructed at the time. The MR image that has already been reconstructed does not contain any undersampling artifacts whatever, which means that, by using such an image as the starting image, particularly fast convergence is ensured for the method of reconstruction according to the invention. Hence, what may be used as a starting image is, for example, an MR image that has already been reconstructed and whose image plane is adjacent to the MR image that has yet to be reconstructed. In acquiring a series of MR images spread over time, what can be used as a starting image is an MR image that was acquired previously as part of the series and that has already been reconstructed. It is also conceivable for the starting image to be generated by interpolation or extrapolation from existing MR images that have already been reconstructed.

The method of reconstruction outlined above is suitable above all when the sampling of the spatial frequency space for the acquisition of the MR signals takes place radial or spirally or in some other non-Cartesian fashion. It is, however, also conceivable for the method according to the invention to be used in cases where Cartesian sampling of the spatial frequency space is used.

An MR apparatus suitable for performing the method according to the invention has a main field coil for generating a homogeneous static magnetic field in an examination volume, a plurality of gradient coils for generating magnetic field gradients in the examination volume, at least one emitting coil for generating high-frequency fields in the examination volume, a plurality of receiving coils for the parallel acquisition of MR signals from the examination volume, and a central control unit for operating the gradient coils and the emitting coil, plus a reconstruction and display unit for processing and showing the MR signals. The method described above can be performed on the MR apparatus according to the invention by means of a suitable programmed control means for the reconstruction and display unit.

The method according to the invention may be made available to the users of pieces of MR apparatus in the form of a corresponding computer program. The computer program may be stored on suitable data carriers, such as CD-ROMs or floppy disks, for example, or it may be downloaded to the reconstruction and display unit of the MR apparatus over the internet.

These and other aspects of the invention are apparent from and will be elucidated with reference to the embodiments described hereinafter.

Figure 1:
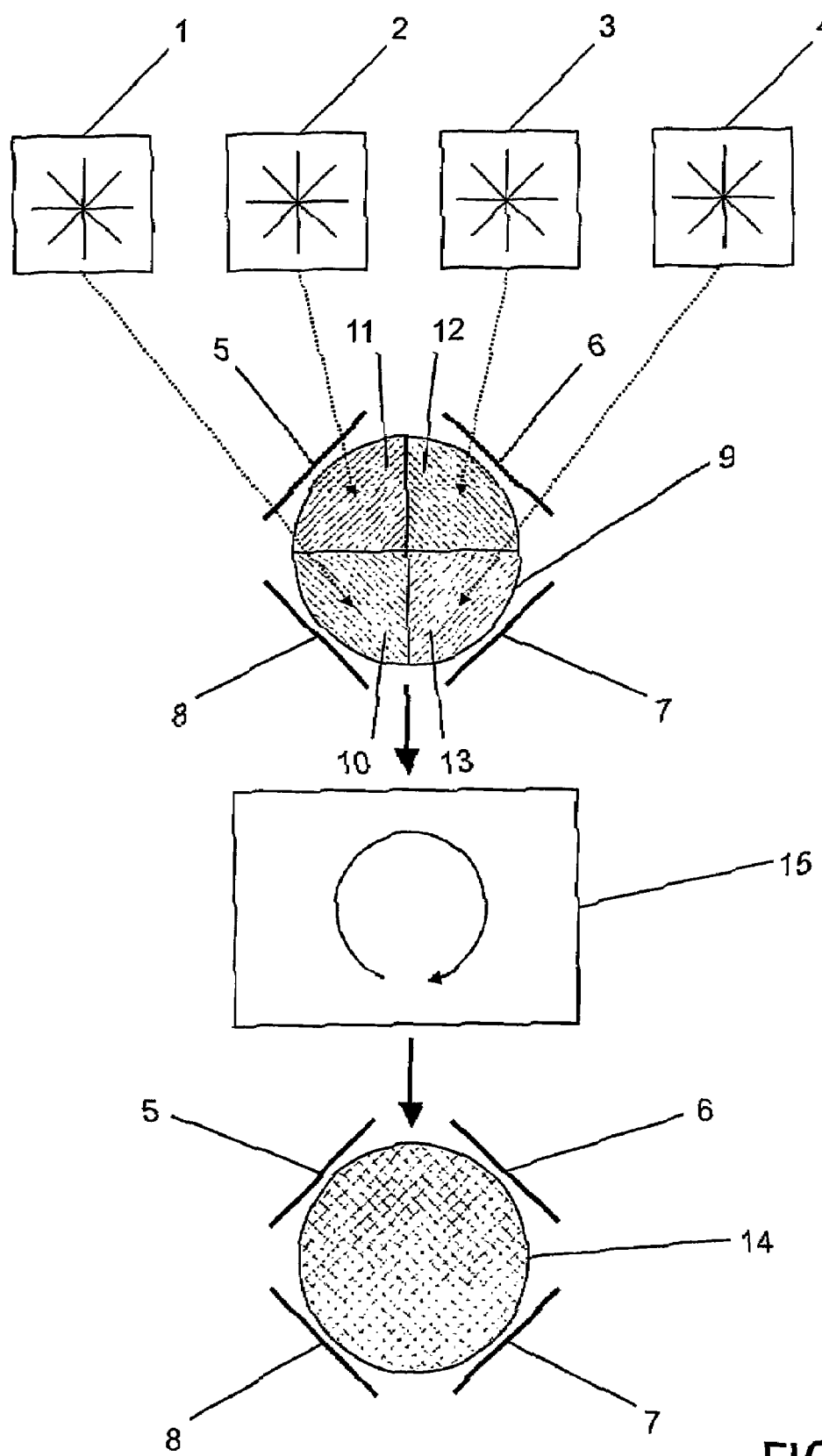
FIG. 1 is a flowchart of a first variant of the method according to the invention.

FIG. 1 shows the procedure followed in the method according to the invention of reconstructing an MR image. The point of departure for the reconstruction is four MR-signal data sets 1, 2, 3, 4. The MR signals have been acquired in parallel, each by incomplete radial sampling of the spatial frequency space. The arrangement of the receiving coils 5, 6, 7 and 8 relative to the circular imaging region that is to be examined (the FOV) is shown in the figure. A starting image 9 is generated from the MR-signal data sets 1, 2, 3 and 4 by reconstructing restricted sub-regions 10, 11, 12, 13 of the starting image 9, which restricted sub-regions are acquired by the receiving coils 8, 5, 6 and 7, which are of high respective sensitivities in these sub-regions. To allow a definite MR image 14 to be reconstructed, an iteration process that is known from the prior art is begun with the starting image that has been generated in this way, the process being indicated in the figure by the symbol 15. The iteration process 15 produces the definitive MR image 14 as the solution of a system of linear equations. The fact that the starting image 9 is generated in the manner described above from the MR signals ensures that undersampling artifacts are suppressed in the intermediate solutions of the system of equations that are obtained during the course of the iteration process 15.

Figure 2:
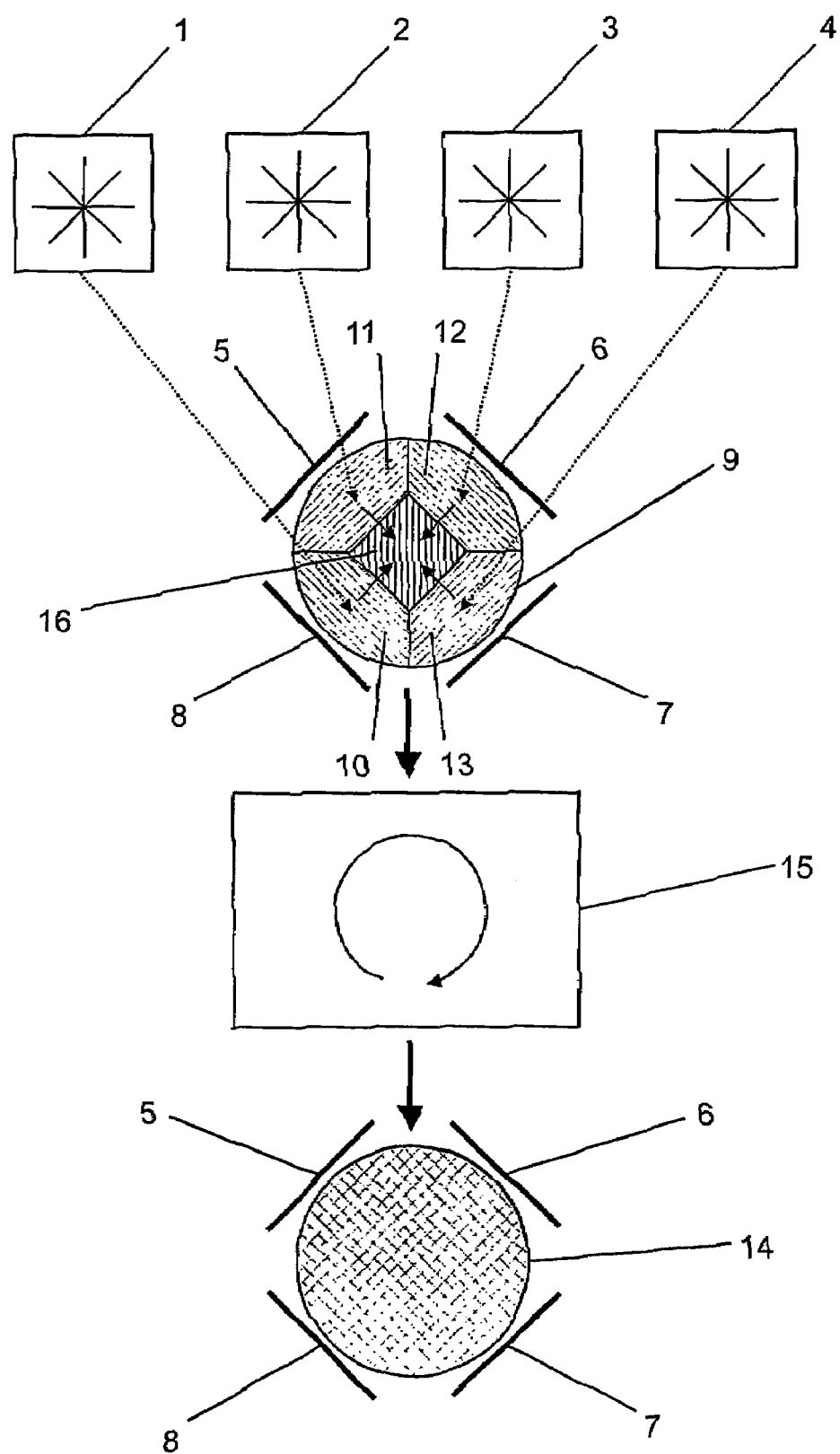
FIG. 2 shows a second variant of the method according to the invention.

In the variant of the method according to the invention that is shown in FIG. 2, the MR-signal data sets 1, 2, 3 and 4 are acquired with a particularly high degree of undersampling, i.e. with a high reduction factor. What this means is that, in a sub-region 16, the starting image cannot be reconstructed, in accordance with the invention, directly from the MR signals acquired by the individual receiving coils 5, 6, 7 and 8. However, the missing image information within the starting image 9 can be synthesized in the sub-region 16 from the MR signals in their entirety. This is done, as described above, by estimating from the sub-regions 10, 11, 12 and 13 the undersampling artifacts that can be expected in the sub-region 16, thus enabling the starting image 9 to be corrected in such a way that it contains as few undersampling artifacts as possible.

Figure 3:
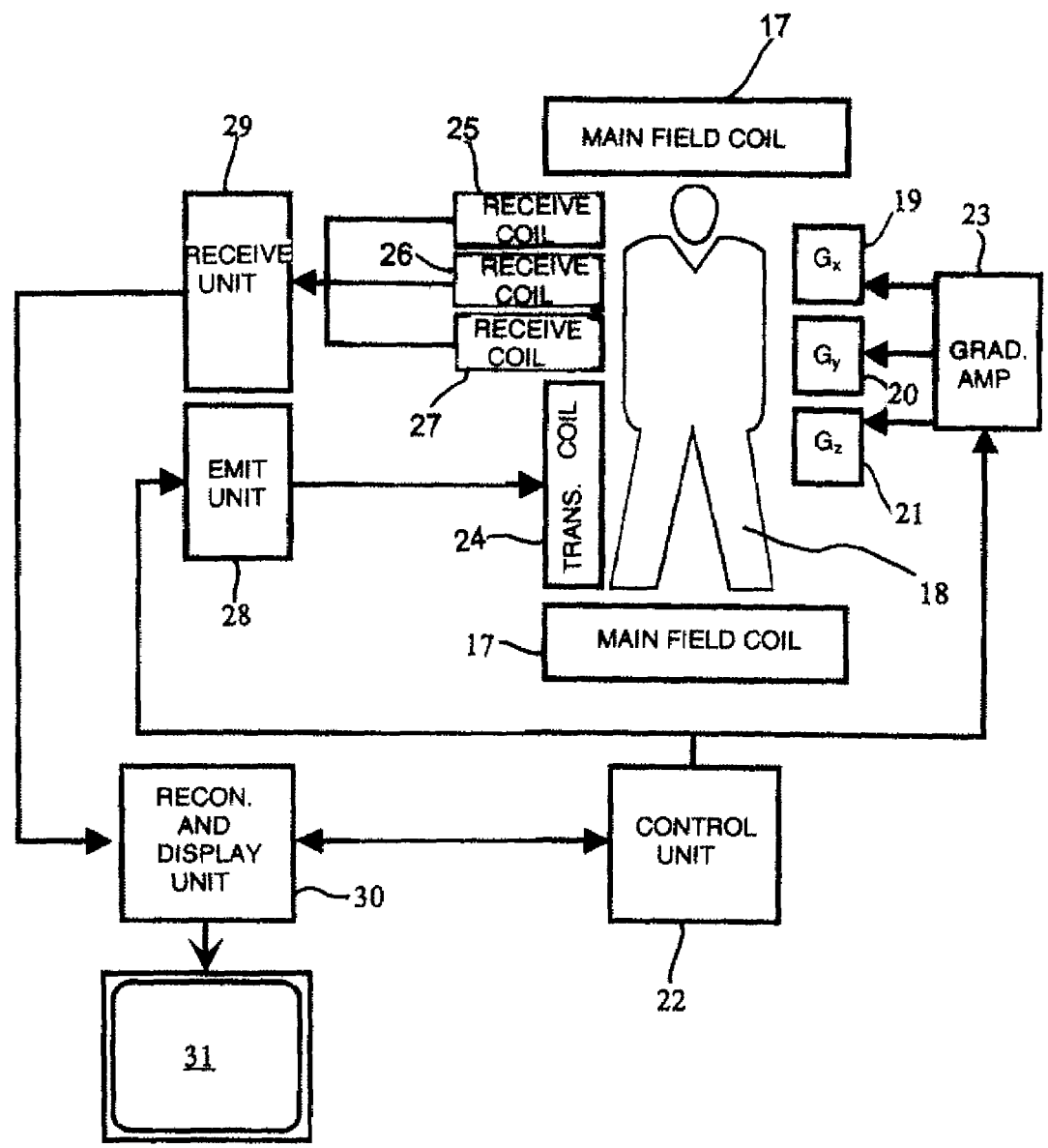
FIG. 3 shows an MR apparatus according to the invention.

FIG. 3 shows an MR apparatus in the form of a block diagram. The MR apparatus comprises a main field coil 17 for generating a homogeneous static magnetic field in an examination volume in which a patient 18 is situated. The MR apparatus also has gradient coils 19, 20 and 21 for generating magnetic field gradients in different directions in space within the examination volume. The pattern followed by the magnetic field gradients with time and in space within the examination volume is controlled by means of a central control unit 22, which is connected to the gradient coils 19, 20 and 21 via a gradient amplifier 23. Also forming part of the MR apparatus shown is an emitting coil 24 for generating high-frequency fields in the examination volume. For the parallel acquisition of MR signals from the examination volume, use is made of three receiving coils 25, 26 and 27, these latter being so arranged that they have different spatial sensitivity profiles within the examination volume, thus enabling them to be used for SENSE imaging. The emitting coil 24 is connected to the control unit 22 via an emitting unit 28. The MR signals acquired by the receiving coils 25, 26 and 27 are demodulated and amplified by means of a receiving unit 29 and fed to a reconstruction and display unit 30. The MR signals processed by the reconstruction and display unit 30 can be shown by means of a screen 31. The reconstruction and display unit 30 has a suitable programmed control means to allow the method described above to be performed.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A method of reconstruction an MR image from MR signals that are acquired in parallel by a plurality of receiving coils with incomplete sampling of the spatial frequency space, the reconstructed MR image being calculated iteratively as the solution of a system of linear equations, wherein the iteration process begins with a starting image which approximates to the MR image to be reconstructed, in such a way that undersampling artifacts are suppressed in the intermediate solutions of the system of linear equations that are obtained during the course of the iteration process, wherein the starting image is generated by reconstructing restricted sub-regions, of the starting image from those MR signals that are acquired by receiving coils that have high respective sensitivities in these sub-regions.

2. The method as claimed in claim 1, wherein in those sub-regions of the starting image that cannot be reconstructed directly from MR signals acquired by individual receiving coils owing to the degree of undersampling, the missing image information is synthesized from the MR signals in their entirety.

3. An MR apparatus having a main field coil for generating a homogeneous static magnetic field in an examination volume, a plurality of gradient coils for generating magnetic field gradients in the examination volume, at least one emitting coil for generating high-frequency fields in the examination volume, a plurality of receiving coils for the parallel acquisition of MR signals from the examination volume, and a central control unit for operating the gradient coils and the emitting coil, plus a reconstruction and display unit for processing and showing the MR signals, wherein the reconstruction and display unit has a programmed control means that operates by the method claimed in claim 1.

4. A computer medium carrying a computer program which when implemented in a reconstruction processor of an MR apparatus controls the MR apparatus to perform the method as claimed in claim 1.

5. The method of reconstructin a new MR image:
acquiring MR signals that are acquired in parallel by a plurality of receiving coils with incomplete sampling of the spatial frequency space;
reconstructing a current MR image by iteratively calculating a solution of a system of linear equations, the iteration process beginning with a starting image, in such a way that undersampling artifacts are suppressed in the intermediate solutions of the system of linear equations that are obtained during the course of the iteration process, the starting image being a prior MR image that was reconstructed prior to and is similar to the current MR image currently being reconstructed.

6. The method as claimed in claim 5, wherein the starting image has a resolution that is reduced in comparison with the current MR image currently being reconstructed.

7. The method as claimed in claim 5, wherein the reconstruction includes reconstructing a plurality of MR slice images, the starting image being generated from a previously reconstructed at least one of the MR slice images of an image plane adjacent to the current MR slice image currently being reconstructed.

8. The method as claimed in claim 7, wherein the starting slice image and the current MR slice image are generated in a common imaging session.

9. The method as claimed in claim 5, wherein a series of prior MR images are reconstructed spread over a plurality of times, the starting image being one of the prior MR images that was reconstructed at a time prior to the current MR image currently being reconstructed.

10. The method as claimed in claim 9, wherein the starting slice image and the current MR slice image are generated in different, temporally displaced imaging sessions.

11. The method as claimed in claim 5, wherein in the acquisition of the MR signals, the sampling of the spatial frequency space takes place or in a non-Cartesian fashion.

12. The method as claimed in claim 5, wherein the MR signals are acquired by sampling radially.

13. An MR apparatus having a main field coil for generating a homogeneous static magnetic field in an examination volume, a plurality of gradient coils for generating magnetic field gradients in the examination volume, at least one emitting coil for generating high-frequency fields in the examination volume, a plurality of receiving coils for the parallel acquisition of MR signals from the examination volume, and a central control unit for operating the gradient coils and the emitting coil, plus a reconstruction and display unit for processing and showing the MR signals, the reconstruction and display unit including at least one processor programmed to perform the method of claim 5.

14. A computer medium carrying a computer program which when implemented in a reconstruction processor of an MR apparatus controls the MR apparatus to perform the method as claimed in claim 5.

* * * * *